United States Patent
Schweighofer (12)

(10) Patent No.: US 6,285,304 B1
(45) Date of Patent: Sep. 4, 2001

(54) ANALOG-TO-DIGITAL CONVERTER CIRCUIT AND CONTROL DEVICE FOR A GRADIENT AMPLIFIER OF A MAGNETIC RESONANCE IMAGING SYSTEM

(75) Inventor: Peter Schweighofer, Nuernberg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/375,040

(22) Filed: Aug. 16, 1999

(30) Foreign Application Priority Data

Aug. 18, 1998 (DE) .............................................. 198 37 440

(51) Int. Cl.⁷ .............................. H03M 1/06; H03M 1/10; G01V 3/00
(52) U.S. Cl. ........................... 341/118; 341/120; 324/318
(58) Field of Search ..................................... 341/118, 120, 341/168, 131, 167, 143; 324/307, 309, 318, 320, 322; 330/10; 363/98

(56) References Cited

U.S. PATENT DOCUMENTS 4,764,752   8/1988   Ormond .............................. 341/167
5,701,076 * 12/1997  Schmitt et al. ....................... 324/322
6,025,720 *  2/2000  Lenz et al. ........................... 324/322
6,118,681 *  9/2000  Schweighofer ........................ 363/98

FOREIGN PATENT DOCUMENTS 38 01 774    7/1989  (DE) .
197 06 756   9/1998  (DE) .

OTHER PUBLICATIONS

Dyer et al, "An Analog Background Calibration Technique for Time–Interleaved Analog–to–Digital Converters," IEEE Journal of Solid–State Circuits, 1912–1919, Dec. 1998.
"Halbleiter–Schaltungstechnik," Tietze et al., Springer–Verlag, 10$^{th}$ Ed. 1993, pp. 784–785.

\* cited by examiner

Primary Examiner—Patrick Wamsley
(74) Attorney, Agent, or Firm—Schiff Hardin & Waite

(57) ABSTRACT

In an analog-to-digital converter circuit and a control device for a gradient amplifier, an analog difference signal is determined from an analog input signal and an analog converter signal. An integrator and an analog-to-digital converter are provided in order to integrate and digitalize the analog difference signal before further evaluation, thereby achieving high precision, resolution and stability with little outlay.

14 Claims, 2 Drawing Sheets

ANALOG-TO-DIGITAL CONVERTER CIRCUIT AND CONTROL DEVICE FOR A GRADIENT AMPLIFIER OF A MAGNETIC RESONANCE IMAGING SYSTEM

BACKGROUND OF THE INVENTION

1. Field of the Invention

The present invention is directed to an analog-to-digital converter circuit and is also directed to a control device for a gradient amplifier of a magnetic resonance tomography apparatus. The analog-to-digital converter circuit can be utilized for all applications wherein high precision, resolution and constancy over time are required. In particular, the analog-to-digital converter circuit is provided for the digitization of an actual current value signal in a control circuit of a gradient amplifier.

2. Description of the Prior Art

In a nuclear magnetic resonance tomography apparatus, magnetic field gradients are produced by gradient coils, each of which is connected to a gradient amplifier. During the measuring event, each gradient coil has a current flowing therein that, for example, can assume values up to 300 A with a predetermined current curve shape. The shape of the current curve must be adhered to exactly up to a few mA. A complicated control circuit is required in order to achieve this precision.

In known gradient amplifiers, the control circuit including the drive electronics for a switched output stage (modulator) is implemented as an analog circuit. This, however, limits the functionality. More complex applications, for example, energy balancing between a number of output stages or a more detailed answerback of individual output stage parameters, cannot be economically accomplished in analog technology.

There is therefore a desire to design the control circuit and modulator as fully digitally as possible, for example with a suitably programmed digital signal processor (DSP). However, the problem of the digitization of the analog actual current value signal determined by a current converter with the required precision, sampling rate and stability thereby arises. A corresponding problem occurs if, instead of the actual current value signal, some other analog signal that is to be digitalized with high precision for input into a digital processing means.

A digital-to-analog converter referred to as "Tracking ADC" is described in the book "Halbleiter-Schaltungstechnik" by U. Tietze and Ch. Schenk, Springer Verlag, $10^{th}$ Edition 1993, pages 784–785, (FIG. 23.43 and associated description). This known converter circuit has a differential amplifier which compares an analog input signal to an analog converter signal and generates an analog difference signal corresponding to the difference therebetween, a digital-to-analog converter which generates the aforementioned analog converter signal from a digital converter value, and a control unit which generates the aforementioned digital converter value as the output of the overall circuit. However, the conversion speed of this circuit as well as the zero point stability and noise suppression are low. Employment thereof for gradient amplifiers is not suggested.

SUMMARY OF THE INVENTION

An object of the present invention is to provide an analog-to-digital converter circuit, and a control circuit therefor, which avoid the aforementioned problems of the prior art and which, with a low outlay, exhibit high precision, resolution and stability.

The above object is achieved in accordance with the principles of the present invention in an analog-to-digital converter circuit having a differential amplifier which compares an analog input signal to an analog converter signal and which generates an analog difference signal according to the difference between these two signals, a digital-to-analog converter which generates the aforementioned analog converter signal from a digital converter value, a control unit which generates the aforementioned digital converter value, which is also the output value of the overall analog-to-digital circuit, an integrator which integrates the analog difference signal and which generates an analog integrator signal dependent in the integration result, and an analog-to-digital converter which generates a digital integrator value from the analog integrator signal, the control unit generating the digital converter value dependent at least on the digital integrator value.

The invention proceeds from the basic idea of determining a deviation of the analog input signal (actual value signal) from an analog converter signal (reference value signal). The analog converter signal (reference value signal) is generated by a high-precision digital-to-analog converter. The objective is to optimally minimize the identified deviation by suitable re-adjustment of the digital-to-analog converter or of the entire control circuit. Inventively, an integrator and a first analog-to-digital converter are provided in order to integrate and digitize the deviation (difference) identified by a differential amplifier before further interpretation.

The integrator acquires the difference signal emitted as an output by the differential amplifier without interruptions. A noise emission into the system is compensated by the integrator. As a result, the integrator achieves an enhanced zero point stability and a high noise suppression.

The first digital-to-analog converter digitizes the integrator output signal. By contrast to a mere comparator, a digital-to-analog converter exhibits an output word width of at least a few bits. A number of deviation classes thus can be distinguished. This enables a fast re-adjustment of the system since the step width of the re-adjustment can be selected to be longer as the absolute amount of the digitalized, integrated deviation (digital integrator value) increases.

The inventive apparatus can, for example, be designed for a resolution and precision of 18 bits given a 100 kHz sampling rate and a stability that is better than the least significant bit. Such values could be hitherto achieved, if at all, only with extremely high outlay.

The employment of an integrator offers the surprising advantage that a sample and hold circuit can be omitted. In conventionally constructed analog-to-digital converters, such a sample and hold circuit must precede the actual converter in order to avoid a falsification of the result in the case of an input voltage that changes during the digitalization process. It is thereby disadvantageous that changes of the input voltage during the hold phase are not acquired, or a brief-duration disturbance during the sampling phase is "frozen" for the entire hold phase. These two effects, that can falsify the measured result, are avoided by the elimination of a sample and hold circuit which is enabled by the invention.

In preferred embodiments, the resolution of the first analog-to-digital converter amounts to between 4 bits and 16 bits and, especially preferred, to between 8 bits and 14 bits. Given these resolution values, a adequately fine graduation of the deviation classes can be obtained with low cost outlay. Given an unchanging input signal, a level change of the digital-to-analog converter by one unit (1 LSB) preferably effects a change of the digital integrator signal by at least one or two or four units. This can be achieved by a suitable design of the converter and/or by an amplification (scaling) of the analog difference value.

The digital-to-analog converter preferably has a very high precision, since its precision directly influences the measured result. The resolution and precision of the digital-to-analog converter preferably amounts to between 16 bits and 24 bits and is at least 2 bits or at least 4 bits or at least 6 bits higher than the resolution of the first analog-to-digital converter.

In order to obtain an especially high system speed, a second analog-to-digital converter is preferably provided that emits the digitalized difference signal as an output directly to the control stage or directly to the regulator. This second analog-to-digital converter in preferred embodiments exhibits characteristics as cited above in conjunction with the first analog-to-digital converter.

Preferably, the control stage or regulator minimizes the amount of the digital integrator value and/or digital difference value. The control stage influences this value with an internal feedback loop that proceeds via the digital-to-analog converter, the differential amplifier and either the second analog-to-digital converter or the integrator and the first analog-to-digital converter. The regulator, by contrast, re-adjusts the digital setting value that is either supplied to a modulator or serves directly for the control of switch elements of a switched output stage. The feedback then ensues via the external control loop from the output stage via the gradient current and the current-measuring sensor to the analog actual value signal.

The integrator preferably allows a defined initial condition to be set in order to set a predetermined initial value (for example, a zero value).

In preferred embodiments, an arrangement for self-diagnosis and/or self-adjustment of the entire apparatus is provided. A further digital-to-analog converter that can be driven by the control stage or by the regulator preferably serves for offset correction. This further digital-to-analog converter preferably has a precision and resolution of 4 through 12 bits and a range of adjustment that amounts to only a slight multiple of the resolution of the precise digital-to-analog converter. The calibration signal generated by the further digital-to-analog converter can, in particular, be supplied to an operational amplifier of the integrator. As a result of such a self-adjustment, an especially precise and long-term drift compensation of the devices can be achieved.

DESCRIPTION OF THE PREFERRED EMBODIMENTS

Figure 1:
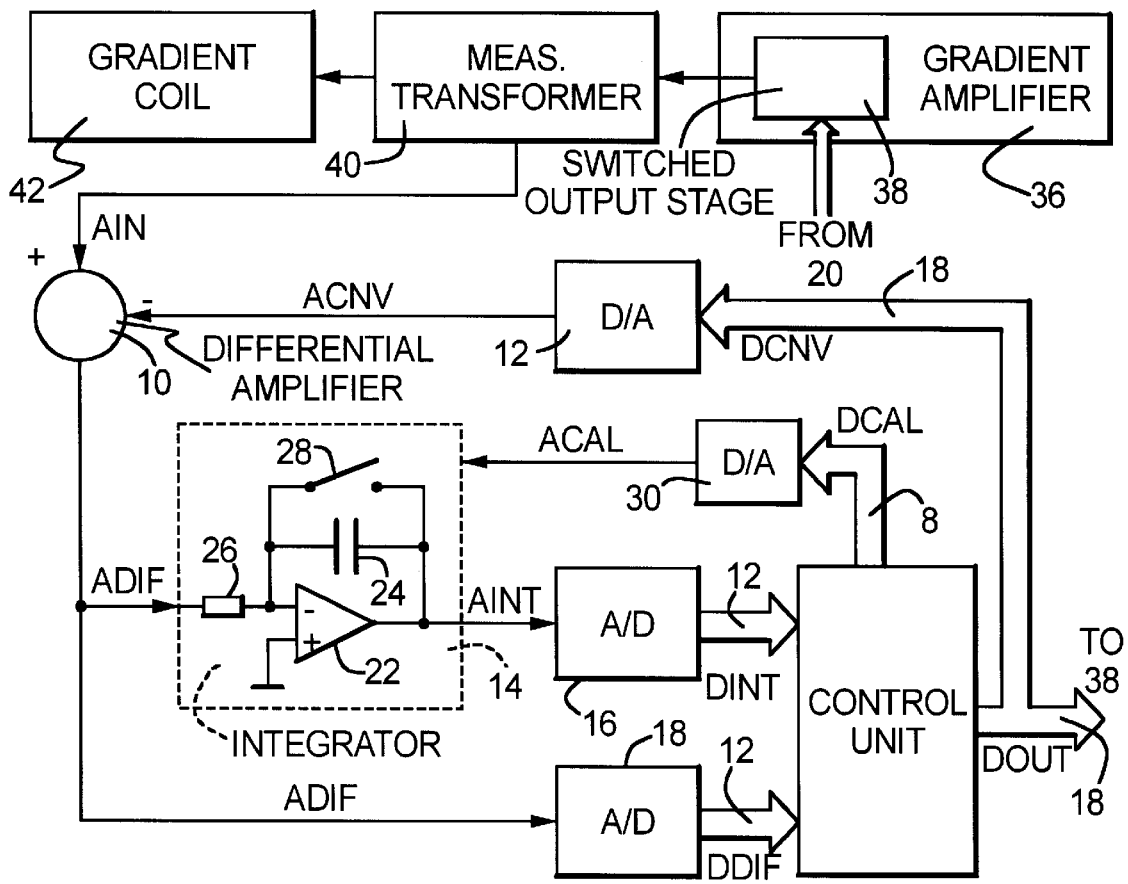
FIG. 1 is a block circuit diagram of an inventive analog-to-digital converter circuit.

The analog-to-digital converter circuit shown in FIG. 1 is a component of a control circuit for a known gradient amplifier 36 of a magnetic resonance tomography apparatus. The gradient amplifier 36 has a known switched output stage 38 from which gradient current is supplied to a gradient coil 42. The gradient current, as is known, is dependent on the switching status of the output stage 38. The analog-to-digital converter circuit receives an analog input signal AIN from a known gradient current-measuring sensor such as a measurement transformer 40 connected can be between the switched output stage 38 and the gradient coil 42. The digitalized output value DOUT further-processed by a suitable, digital regulator (not shown).

The analog input value AIN is present at the non-inverting input of an analog differential amplifier 10 fashioned as an operational amplifier. The inverting input of the differential amplifier 10 receives an analog converter signal ACNV from a high-precision digital-to-analog converter 12. The digital converter value DCNV at the digital-to-analog converter 12 is identical to the digital output value DOUT. The word width of the digital transducer value DCNV amounts to 18 bits, and the digital-to-analog converter 12 has a correspondingly high resolution and precision in the region of a few ppm.

The differential amplifier 10, which likewise exhibits a precision in the ppm range, generates an analog difference signal ADIF that is supplied to an integrator 14. The task of the integrator 14 is to average out brief-duration noise pulses and random noise. As an output signal, the integrator 14 supplies an analog integration signal AINT that is digitalized by a first analog-to-digital converter 16 in order to obtain a digital integrator value DINT. The digital integrator value DINT serves as input value for a control unit 20 that generates the digital output value DOUT, which is supplied to the output stage 38 to actuate switches therein that set the switching status of the output stage 38.

The analog difference signal ADIF of the differential amplifier 10 is also converted by a second analog-to-digital converter 18 into a digital difference value DIFF that is likewise supplied to the control unit 20. The two digital values DINT, DIFF are respectively 8 bits wide. Accordingly, the resolution and precision of the two analog-to-digital converters 16, 18 is likewise approximately 8 bits.

The control unit 20 in the exemplary embodiment described herein is fashioned as a suitably programmed digital processor, for example as a digital signal processor (DSP). In addition to its function as the control unit 20, this processor can assume a number of further tasks. In alternative embodiments, the control means 20 is an integrated digital circuit, particularly an EPLD module (EPLD= electrically programmable logic device). The digital values DINT, DDIF, DOUT can be transmitted to or from the control unit 20 on a number of parallel lines or serially bit-by-bit or in mixed forms.

The integrator 14 includes an operational amplifier 22 that is interconnected with an integration capacitor 24 and an input resistor 26 to form an integration circuit. The integration capacitor 24 can be discharged with a switch 28, which can be as a relay or as a semiconductor switch, driven by the control unit 20 in order to set the integrator 14 to a defined initial condition.

A further digital-to-analog converter 30 having a precision of 8 bits receives a digital calibration value DCAL from the control unit 20 and generates an analog calibration signal ACAL. The analog calibration signal ACAL is supplied to the integrator 14, to the operational amplifier 22 thereof to be more precise. The signal ACAL serves for offset compensation of the operational amplifier 22 during an automatic calibration.

During operation of the analog-to-digital converter means shown in FIG. 1, the control unit 20 generates the digital converter value DCNV (and thus the digital output value DOUT) with the objective of optimally minimizing the deviation between the analog input signal AIN and the analog converter signal ACNV, or at least keeping it small. When (in the ideal case) the two analog signals AIN and ACNV coincide, then the digital output value DOUT is a digitization of the analog input signal AIN, whose precision is dependent on the precision of the digital-to-analog converter 12.

When, for example, the analog input signal AIN is greater than the analog converter signal ACNV, then the differential amplifier 10 generates a positive analog difference signal ADIF, resulting in a positive digital signal DDIF derives. Since the integrator 14 in the exemplary embodiment shown herein acts in inverting fashion, the analog integrator signal AINT is gradually reduced and ultimately becomes zero. The digital integrator signal DINT changes correspondingly. As a reaction thereto, the control unit 20 increases the digital output value DOUT in order to adapt the analog converter signal ACNV to the analog input signal AIN. Conversely, the control unit 20 reduces the digital output value DOUT when the current analog converter signal ACNV is greater than the analog input signal AIN.

In order to adapt the digital output value DOUT to the analog input signal AIN as fast possible, the control unit 20 modifies the digital output signal DOUT with a step width that is dependent on the momentary deviation. This step width is determined from the magnitudes of the digital values DINT and DDIF. For example, there can be a linear relationship between the step width and an average of the two digital values DINT and DDIF, however, any other relationships between DINT, DDIF and the modification speed are possible. In alternative embodiments, the analog-to-digital converters 16, 18 have only a small output word width, so that there are only a few different modification speeds (only a single one in the extreme case).

The control unit 20 determines the modified, digital output value DOUT by an interpretation of predetermined formula relationships and/or by an access to a precalculated look-up table that contains modification data for the output value DOUT dependent on the values DINT and DDIF.

The second analog-to-digital converter 18 can be omitted in a simpler alternative embodiment of the circuit shown in FIG. 1. The digital output value DOUT is then determined only dependent on the digital integrator value DINT.

Upon initialization of the system, the charge condition of the integration capacitor 24 is undefined. The control unit 20 thus briefly closes the switch 28 in order to discharge the integration capacitor 24. The switch 28 is not present in alternative embodiments. Instead, an initialization phase is implemented wherein the integrator is regulated to zero or some other desired starting value via an internal control loop using a forward/backward counter with variable step width.

When the gradient amplifier is not in operation after turn-on, or in pauses between the measurements, then the analog input signal AIN has the value zero. In the ideal case, the digital values DINT, DDIF and DCNV are all equal to zero. Deviations from these values can be utilized for self-diagnosis of the digital-to-analog converter circuit.

Stated more exactly, the digital converter value DCNV that must be applied to the digital-to-analog converter 12 in order to cause the value zero of the digital integrator signal DINT to correspond to the sum of the deviations or errors in the digital-to-analog converter 12, the differential amplifier 10, the integrator 14 and the first analog-to-digital converter 16. When the digital converter value DCNV exceeds a predetermined limit, the control unit 20 interprets this as a malfunction and reports it to a device controller. The values DINT and (when present) DDIF can also be evaluated by the control unit 20 for limitation of the error.

As a rule, a balancing is required in the manufacture and maintenance of the analog-to-digital converter circuit in order to compensate for deviations or offsets at the digital-to-analog converter 12, the differential amplifier 10, the integrator 14 and the two analog-to-digital converters 16, 18. Suitable automatic or manual balancing devices for each of these components are provided for the correction of these offsets in alternative embodiments. In the exemplary embodiment described herein, an offset compensation of the integrator 14 ensues with the analog calibration signal ACAL. As a result of this calibration, deviations of the digital-to-analog converter 12, of the differential amplifier 10 and of the integrator 14 can be corrected in common.

In the exemplary embodiment described herein, the offset compensation occurs following the described self-monitoring after the gradient amplifier is turned on or in pauses between the measurements, when the analog input signal AIN has the value zero. For such compensation, the control unit 20 designationally varies the digital calibration value DCAL in order to minimize the drift of the integrator 14 over a predetermined measuring interval. The further digital-to-analog converter 30 is dimensioned such that the range of adjustment of the offset compensation amounts to only a few units of the digital integrator word DINT. As a result, a very exact balancing and a long-term drift compensation are possible.

Figure 2:
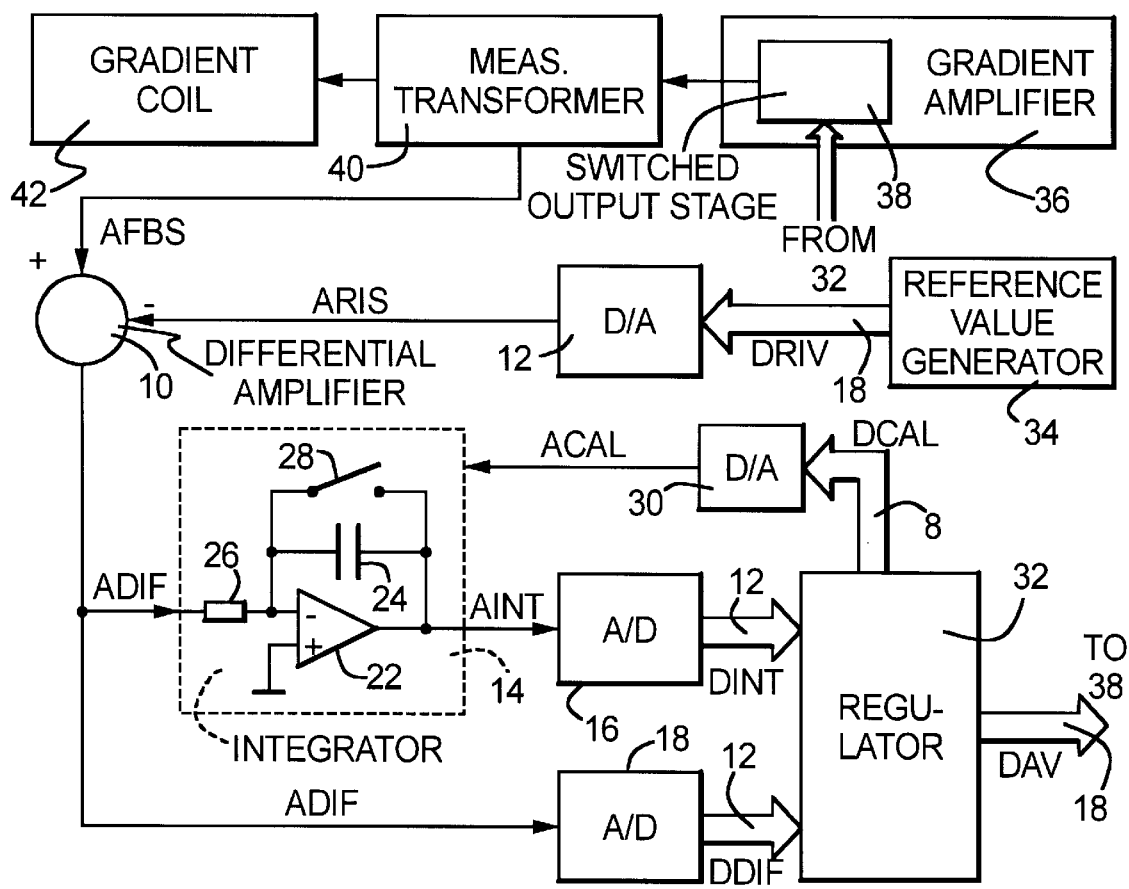
FIG. 2 is a block circuit diagram of an inventive control device for a gradient amplifier of a magnetic resonance tomography apparatus.

The exemplary embodiment shown in FIG. 2 is very similar to that of FIG. 1, so that the description that has already been provided can be referenced. The circuit according to FIG. 2 is a control device of a gradient amplifier that receives an analog actual value signal AFBS as the input signal and generates a digital actuating value DAV as the output value.

According to FIG. 2, a regulator 32 is provided instead of the control unit 20, but this can be fashioned as a suitably programmed DSP or as an EPLD, just like the control unit 20. The digital-to-analog converter 12 receives a digital reference value DRIV from a reference value generator 34. The reference value generator 34 can be a memory module which contains characteristic data for the shape of the current curve to be offered by the gradient amplifier. Alternatively, the reference value generator 34 can be fashioned as a program routine of the same DSP that forms the regulator 32.

The digital-to-analog converter 12 emits an analog reference value signal ARIS as an output to the differential amplifier 10. This signal is processed just like the analog converter signal ACNV in order to obtain the two digital values DINT and DDIF. The digital difference value DDIF can thereby be interpreted as an actuating variable, whereas the digital integrator value DINT offers the I-part of the current regulation.

The regulator 32 processes the digital values DINT and DIFF according to a known PI regulating method. Again, the objective of the regulation is to minimize the digital values DINT and DDIF. This ensues indirectly by means of the digital adjustment value DAV (either directly or via a modulator) driving the switched output stage 38 of the gradient amplifier 36. The gradient current produced by the switched output stage 38 is measured by the current transformer 40. The current transformer 40 generates the analog actual value signal AFBS that is proportional to the gradient current and is present at the differential amplifier 10.

Although modifications and changes may be suggested by those skilled in the art, it is the intention of the inventor to embody within the patent warranted hereon all changes and modifications as reasonably and properly come within the scope of his contribution to the art.

I claim as my invention:

1. A controlled gradient amplifier for a magnetic resonance imaging system, said controlled gradient amplifier comprising:

a gradient amplifier having a switched output stage which emits a gradient current;

a current measurement element connected to said switched output stage, which measures said gradient current and emits an analog actual value signal corresponding thereto;

a reference value generator which generates a digital reference value representing a desired value for said gradient current;

a digital-to-analog converter supplied with said digital reference value from said reference value generator, which converts said digital reference value into an analog reference value signal;

a differential amplifier supplied with said analog signal and supplied with said analog reference value signal from said digital-to-analog converter, which generates an analog difference signal dependent on a difference between said analog actual value signal and said analog reference value signal;

an integrator supplied with said difference signal from said differential amplifier, which integrates said difference signal to generate an analog integrator signal;

an analog-to-digital converter supplied with said analog integrator signal, which converts said analog integrator signal into a digital integrator value; and a regulator supplied with said digital integrator value which generates a digital adjusting value dependent at least on said digital integrator value, said regulator being connected to said switched output stage and supplying said digital actuating value thereto to actuate said switched output state.

2. A controlled gradient amplifier as claimed in claim 1 wherein said analog-to-digital converter is a first analog-to-digital converter, and further comprising a second analog-to-digital converter, supplied with said analog difference signal from said differential amplifier, which generates a digital difference value from said analog difference signal, said regulator also being supplied with said digital difference value from said second analog-to-digital converter and defining said digital converter value dependent on said digital integrator value and on said digital difference value.

3. A controlled gradient amplifier as claimed in claim 2 wherein said digital-to-analog converter and said first analog-to-digital converter have respective resolutions, and wherein the resolution of said digital-to-analog converter is at least 2 bits higher than the resolution of said first analog-to-digital converter.

4. A controlled gradient amplifier as claimed in claim 3 wherein said first analog-to-digital converter has a resolution of at least 4 bits.

5. A controlled gradient amplifier as claimed in claim 4 wherein said first analog-to-digital converter has a resolution of at least 8 bits.

6. A controlled gradient amplifier as claimed in claim 2 wherein said digital-to-analog converter and said second analog-to-digital converter have respective resolutions, and wherein the resolution of said digital-to-analog converter is at least 2 bits higher than the resolution of said second analog-to-digital converter.

7. A controlled gradient amplifier as claimed in claim 6 wherein said second analog-to-digital converter has a resolution of at least 4 bits.

8. A controlled gradient amplifier as claimed in claim 7 wherein said second analog-to-digital converter has a resolution of at least 8 bits.

9. A controlled gradient amplifier as claimed in claim 2 wherein said digital-to-analog converter, said first analog-to-digital converter and said second analog-to-digital converter have respective resolutions, and wherein the resolution of said digital-to-analog converter is at least 2 bits higher than the resolution of either of said first analog-to-digital converter and said second analog-to-digital converter.

10. A controlled gradient amplifier as claimed in claim 9 in each of said first and second analog-to-digital converters has a resolution of at least 4 bits.

11. A controlled gradient amplifier as claimed in claim 10 in each of said first and second analog-to-digital converters has a resolution of at least 8 bits.

12. A controlled gradient amplifier as claimed in claim 2 wherein said regulator defines said digital converter value so as to minimize at least one of said digital integrator value and said digital difference value.

13. A controlled gradient amplifier as claimed in claim 1 wherein said integrator comprises means for setting a defined initial condition of said integrator.

14. A controlled gradient amplifier as claimed in claim 13 wherein said regulator generates a digital calibration value, and wherein said digital-to-analog converter is a first digital-to-analog converter, and wherein said analog-to-digital circuit further comprises a second digital-to-analog converter, supplied with said digital calibration value from said regulator, which generates an analog-to-digital calibration value, said means for setting a defined initial condition in said integrator receiving said analog calibration value and setting said initial condition dependent thereon.

* * * * *